(12) United States Patent
Funahara et al.

(10) Patent No.: US 6,819,191 B2
(45) Date of Patent: Nov. 16, 2004

(54) PIEZOELECTRIC OSCILLATOR UNIT

(75) Inventors: Toshikazu Funahara, Omihachiman (JP); Makoto Fujita, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 11 days.

(21) Appl. No.: 09/738,374

(22) Filed: Dec. 15, 2000

(65) Prior Publication Data

US 2001/0019292 A1 Sep. 6, 2001

(30) Foreign Application Priority Data

Dec. 15, 1999 (JP) .......................................... 11-355535

(51) Int. Cl.[7] ................................................ H03B 1/00
(52) U.S. Cl. ..................... 331/68; 331/177 V; 331/158; 331/108 D; 257/728
(58) Field of Search ............................... 331/68, 108 D, 331/158, 177 V; 257/728; 438/123; 361/810

(56) References Cited

U.S. PATENT DOCUMENTS

| 5,650,755 A | * | 7/1997 | Avanic et al. | ................. 331/67 |
|---|---|---|---|---|
| 5,661,441 A | * | 8/1997 | Morino et al. | ................. 331/67 |
| 5,880,553 A | * | 3/1999 | Okeshi et al. | ............... 310/352 |
| 5,949,294 A | * | 9/1999 | Kondo et al. | .................. 331/68 |
| 6,229,404 B1 | * | 5/2001 | Hatanaka | ...................... 331/68 |

FOREIGN PATENT DOCUMENTS

| JP | 4-132404 | 5/1992 |
|---|---|---|
| JP | 7-254781 | 10/1995 |
| JP | 8-83977 | 3/1996 |
| JP | 9-260948 | 10/1997 |
| JP | 10-163356 | 6/1998 |

* cited by examiner

*Primary Examiner*—Arnold Kinkead
(74) *Attorney, Agent, or Firm*—Keating & Bennett, LLP

(57) ABSTRACT

A piezoelectric oscillator unit maintains the adhesive force of a quartz vibrator package with respect to a circuit substrate even when the solder connecting the quartz vibrator package to the circuit substrate melts. This prevents the vibrator package from lifting from or falling off of the circuit substrate. In this piezoelectric oscillator unit, a quartz vibrator housing a quartz member is overlaid on a box-shaped circuit substrate on which an oscillating circuit, a temperature compensation circuit, or other circuits are mounted. The electrodes provided on the four corners of the top surface of the circuit substrate and the electrodes provided on the four corners of the bottom surface of the quartz vibrator are bonded together using solder, and also the circuit substrate and the quartz vibrator are mechanically coupled by an adhesive.

7 Claims, 3 Drawing Sheets ic oscillator unit, and more particularly, to a surface-mounted piezoelectric oscillator unit utilizing a quartz vibrator to provide a standard frequency used in a portable terminal.

PIEZOELECTRIC OSCILLATOR UNIT

BACKGROUND OF THE INVENTION

1. Field of the Invention

The present invention relates to a piezoelectric oscillator unit, and more particularly, to a surface-mounted piezoelectric oscillator unit utilizing a quartz vibrator to provide a standard frequency used in a portable terminal.

2. Description of the Related Art

FIG. 6 shows a conventional quartz oscillator unit 31 using a surface-mounted quartz vibrator package. In this quartz oscillator unit 31, a surface-mounted quartz vibrator package 33 is mounted on the top surface of a flat circuit substrate 32, electrodes provided on the bottom surface of the quartz vibrator package 33 are electrically connected to electrode pads on the circuit substrate 32 by reflow soldering, and the quartz vibrator package 33 is mechanically fixed to the circuit substrate 32 with solder 34. Circuit components 35 and 36 defining an oscillating circuit, and a temperature compensation circuit are mounted on the circuit substrate 32, a shielding case 37 is provided on the circuit substrate 32 to cover the quartz vibrator package 33 and the circuit components 35 and 36, and the shielding case 37 is soldered to the circuit substrate 32 with solder 38.

In the quartz oscillator unit 31 having the structure described above, however, the quartz vibrator package 33 and the shielding case 37 are connected to the circuit substrate 32 mechanically and electrically only by solder, and hence, when attempting to solder the quartz oscillator unit 31 to a printed-circuit board by reflow soldering or flow soldering, the solder 34 which has bonded the quartz vibrator package 33 to the circuit substrate 32 melts in the process of reflow soldering or flow soldering, such that the quartz vibrator package 33 may be lifted from the circuit substrate 32 or may slide thereon. Also, when reflow soldering or flow soldering the printed-circuit substrate 32 while laying the circuit substrate face down with the quartz oscillator unit 31 at the lower side, the quartz vibrator package 33 may fall off from the circuit substrate 32 due to vibrations occurring during reflow soldering once the solder 34 melts.

Furthermore, when the quartz oscillator unit 31 is reflow soldered or flow soldered, not only the quartz vibrator package 33, but also the shielding case 37, may lift off of the circuit substrate 32, move thereon, or fall off of the circuit substrate 32.

Moreover, not only in the case where the quartz oscillator unit 31 is mounted, but also in the case where the equipment printed-circuit substrate on which the quartz oscillator unit 31 has been mounted is repaired, when the equipment printed-circuit substrate is placed on a heating plate to melt the solder, and the quartz oscillator unit 31 is removed from the equipment printed-circuit substrate, the heat of the melted solder and that of the heating plate causes the quartz vibrator package 33 and/or the shielding case 37 to lift or detach from the circuit substrate 32.

In recent years, with the miniaturization of quartz oscillator units, circuit substrates have been miniaturized to a size comparable to that of the quartz vibrator package, and consequently the space for soldering the shielding case to the circuit substrate in the quartz oscillator unit is greatly reduced or eliminated. A quartz oscillator unit having no shielding case has been introduced, and which uses only the shielding effect of the quartz vibrator package itself. In such a quartz oscillator unit, since the quartz vibrator package thereof is not covered with a shielding case, the likelihood that the quartz vibrator package will lift from or fall off the circuit substrate due to the heat in the reflow soldering and the heat of the heating plate is greatly increased.

To prevent such problems, high-temperature solder may be used to fix the quartz vibrator package and the shielding case to the circuit substrate by reflow soldering. The high-temperature solder is, however, difficult to handle, because the use of the high-temperature solder requires a higher heating temperature reflow furnace which can produce adverse effects on semiconductor components.

SUMMARY OF THE INVENTION

To overcome the above-described problems, preferred embodiments of the present invention provide a piezoelectric oscillator unit which maintains the adhesive force of the vibrator package with respect to the circuit substrate even when the solder connecting the quartz vibrator package to the circuit substrate melts, that is, a piezoelectric oscillator unit which is capable of preventing the vibrator package from lifting from or falling off the circuit substrate even if the vibrator package is subjected to heating when the piezoelectric oscillator unit is mounted or repaired.

A first preferred embodiment of the present invention provides a piezoelectric oscillator unit including a vibrator package housing a piezoelectric component which is overlaid on a circuit substrate on which an oscillating circuit is mounted, and in which the electrodes provided on the top surface of the circuit substrate and the electrodes provided on the bottom surface of the vibrator package are bonded together using a brazing material such as solder, wherein the circuit substrate and the vibrator package are bonded together via an adhesive.

In the piezoelectric oscillator unit in accordance with the first preferred embodiment of the present invention, since the vibrator package housing the piezoelectric member (a quartz member for example) is overlaid on the circuit substrate, and the vibrator package and the circuit substrate are bonded together using an adhesive such as a thermosetting adhesive, the adhesive force between the vibrator package and the circuit substrate is maintained even when the solder bonding the quartz vibrator package to the circuit substrate is melted by the heat of a reflow furnace, a flow soldering device, a heating plate for repair, or other heat sources. This prevents the vibrator package from developing defects such as lifting from or falling off the circuit substrate in the mounting or repairing process.

Also, since the adhesion area between the vibrator package and the circuit substrate is greatly increased, the transverse rupture strength of the piezoelectric oscillator unit is greatly enhanced. Among the overlapping surfaces of the quartz vibrator package and the circuit substrate, the bonding surfaces to be bonded by an adhesive include the entire surfaces except for the electrode portions, or portions thereof.

A second preferred embodiment of the present invention provides a piezoelectric oscillator unit including a vibrator package housing a piezoelectric member which is overlaid on a circuit substrate on which an oscillating circuit is mounted, and in which the electrodes provided on the top surface of the circuit substrate and the electrodes provided on the bottom surface of the vibrator package are bonded together using a brazing material such as solder, wherein the vibrator package is covered with a shielding case, the vibrator package is held by the shielding case, and the shielding case is adhered to the circuit substrate by an adhesive.

In the piezoelectric oscillator unit in accordance with the second preferred embodiment of the present invention, since the shielding case covering the vibrator package is adhered to the circuit substrate by an adhesive such as a thermosetting adhesive, and the vibrator package is held by the shielding case, the vibrator package is retained by the shielding case, even when the solder bonding the quartz vibrator package to the circuit substrate is melted by the heat of are flow furnace, a flow soldering device, a heating plate for repair, or other heat source. This prevents the vibrator package from developing defects such as lifting from or falling off the circuit substrate.

Preferably, in the piezoelectric oscillator unit in accordance with the second preferred embodiment of the present invention, each of a plurality of protrusions provided on the shielding case is inserted into a corresponding hole provided in the circuit substrate, and each of the protrusions on the shielding case is fixed in the corresponding hole in the circuit substrate by the adhesive, which is provided in each of the holes.

As described above, since the piezoelectric oscillator unit is arranged such that each of the protrusions on the shielding case is inserted into one of the holes in the circuit substrate, the shielding case is accurately positioned even when the area of the circuit substrate is small. Further, since each of the protrusions is fixed by the adhesive provided in one of the holes, the shielding case is securely fixed to the circuit substrate.

Other features, elements, characteristics and advantages of the present invention will become more apparent from the detailed description of preferred embodiments below with reference to the attached drawings.

DETAILED DESCRIPTION OF PREFERRED EMBODIMENTS

Figure 1:
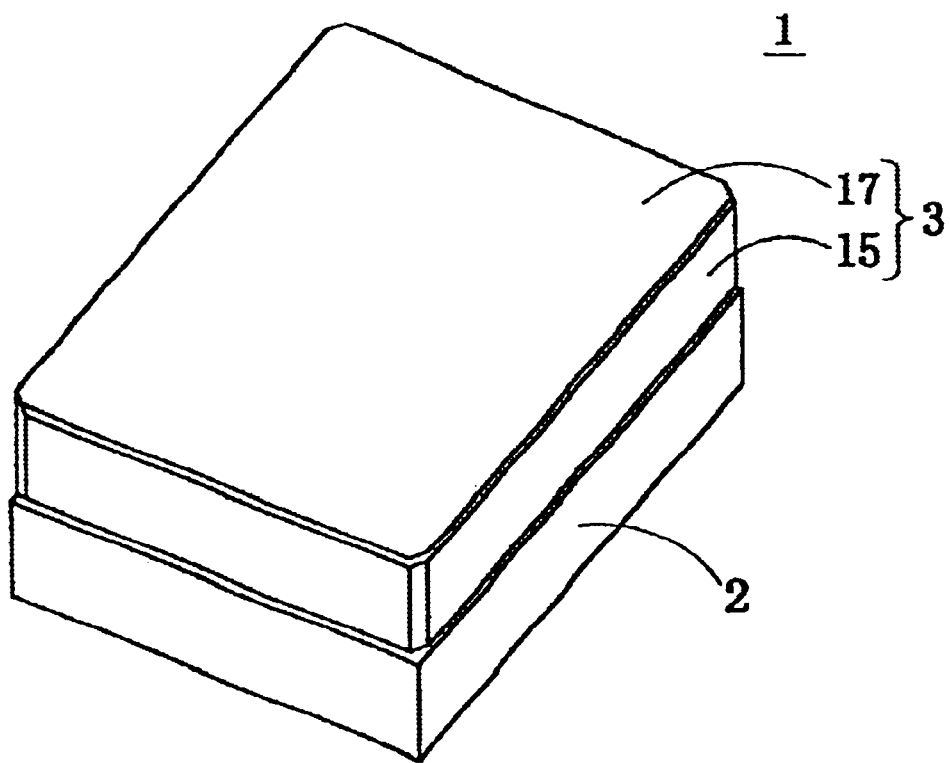
FIG. 1 is a perspective view showing a quartz oscillator unit in accordance with a preferred embodiment of the present invention.
Figure 2:
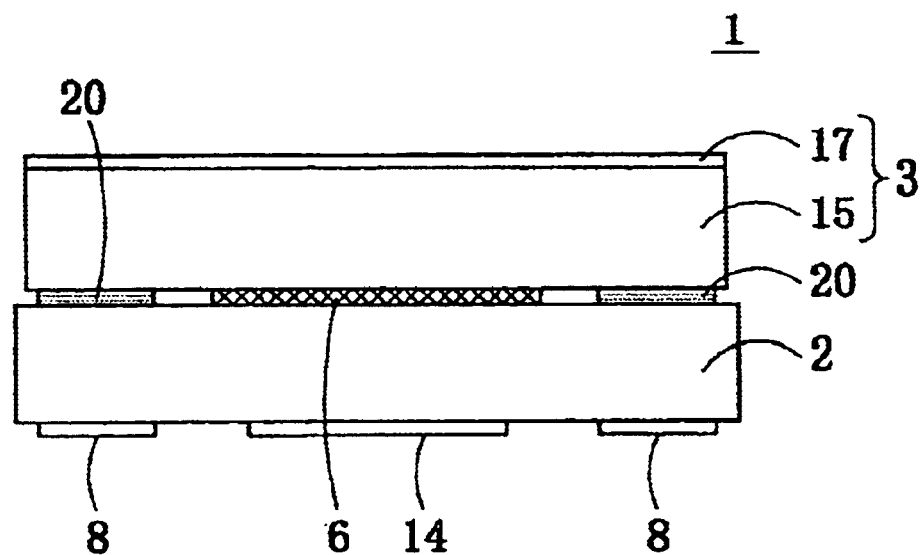
FIG. 2 is a side view of the quartz oscillator unit shown in FIG. 1.

FIG. 1 is a perspective view showing a temperature compensation type quartz oscillator unit 1 in accordance with a first preferred embodiment of the present invention. FIG. 2 is a side view of the quartz oscillator unit 1 in FIG. 1. This quartz oscillator unit 1 includes a surface-mounted quartz vibrator package 3 (hereinafter, referred to as a "quartz vibrator") integrally stacked on a box-shaped ceramic circuit substrate 2. By thus producing the quartz vibrator 3 separately from the circuit, variations in the accuracy among quartz vibrators is greatly reduced and the frequency accuracy is greatly improved. In addition, by integrally stacking the quartz vibrator 3 on the circuit substrate 2, the quartz oscillator unit 3 defines a lid of the box-shaped circuit substrate 2. This allows the number of components to be reduced and enables the size of the quartz oscillator unit 1 to be greatly reduced.

Figure 3:
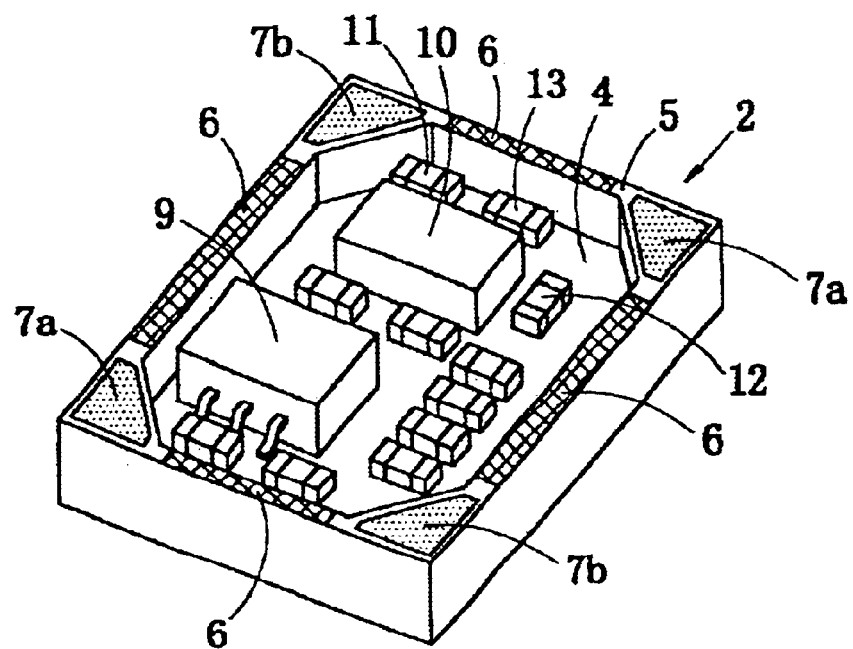
FIG. 3 is a perspective view illustrating a circuit substrate on which an oscillating circuit and other circuits in the quartz oscillator unit shown in FIG. 1 are mounted.

Next, the structure of the circuit substrate 2 side will be described. FIG. 3 is a perspective view illustrating a circuit substrate 2 on which circuit components have been mounted. The circuit substrate 2 is defined by a multilayer ceramic substrate, and includes a cavity 4 disposed at the approximate center thereof for mounting components, with a wall 5 provided around the cavity 4. Within the cavity 4, wiring patterns (not shown), each defined by thick film conductors, are formed by printing and firing of a conductive paste. Connection electrodes 7a and 7b, each defined by thick films, are provided at the four corners of the top surface of the wall 5, and external electrodes 8 are provided at the four corners of the bottom surface, as shown in FIG. 2. Connection electrodes 7a and 7b on the top surface provide connection to the quartz vibrator 3. Two electrodes 7a of the four electrodes 7a and 7b are connected to the terminal electrodes of the quartz vibrator 3. The other two electrodes 7b are connected to a shielding plate 17, and constitute ground electrodes. On the other hand, the external electrodes 8 on the bottom surface are used as the electrodes when the quartz oscillator unit 1 is surface-mounted on the printed-circuit substrate or other substrate. One of these four external electrodes 8 is used for outputting signals, another one is connected to the power supply line, and the remaining two are connected to a ground line. Although not shown in the figure, the connection electrodes 7a and 7b, the external electrodes 8, and the wiring patterns are interconnected through multilayer-structured embedded wiring in the circuit substrate 2 and through via holes. Also, within the circuit substrate 2, metallic layers for shielding (not shown) are laminated.

Among the circuits constituting the quartz oscillator unit 1, such as an oscillating circuit, a temperature compensation circuit, and a buffer amplifier circuit, circuit components other than the quartz vibrator 3 are provided on the circuit substrate 2. Therefore, surface-mounted circuit components constituting these circuits are mounted on the circuit substrate 2 preferably by reflow soldering. For example, within the cavity 4, a transistor 9 for oscillation and buffer amplification, a varicap diode 10, a multilayer capacitor 11, a chip thermistor 12 for temperature compensation, a chip resistor 13, and other components, are surface-mounted. On the bottom surface of the circuit substrate 2, a printed resistor 14 is provided. The bottom surface of the circuit substrate 2, except at the sites of external electrodes 8, is covered with an insulating film.

Figure 4:
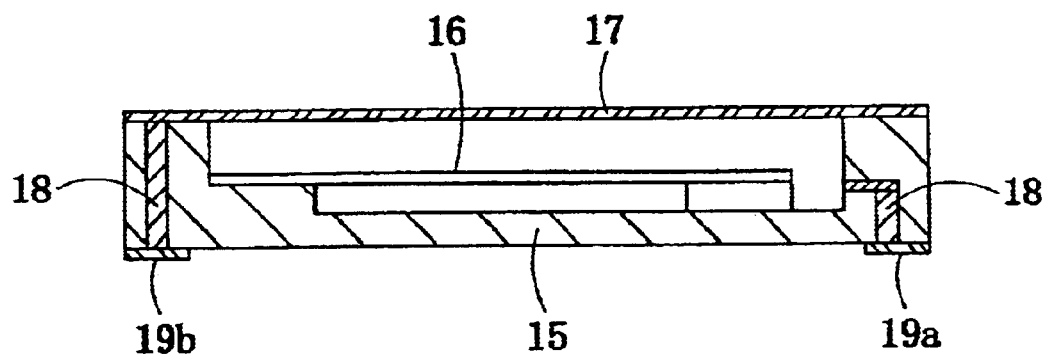
FIG. 4 is a sectional view illustrating a quartz vibrator package in the quartz oscillator unit shown in FIG. 1.

Next, the structure of the quartz vibrator 3 will be described with reference to FIG. 4. A quartz member 16 is housed in a case 15 with the top surface thereof opened, and both ends thereof are supported by the case 15. The entire top surface of the case 15 is covered with the shielding plate 17, and the quartz member 16 is hermetically sealed in the package defined by the case 15 and the shielding plate 17. Electrodes 19a and 19b are provided at the four corners of the bottom surface of the case 15. Two electrodes 19a among these four electrodes are connected to the electrodes of the quartz member 16 through via holes 18, and the other two electrodes 19b are connected to the shielding plate 17 through the via holes 18.

The connection electrodes 7a on the top surface of the circuit substrate 2 and the electrodes 19a on the bottom surface of the quartz vibrator 3 are reflow soldered, and the connection electrodes 7b on the top surface of the circuit substrate 2 and the electrodes 19b on the bottom surface of the quartz vibrator 3 are also reflow soldered. The connection electrodes 7a and 7b of the circuit substrate 2 and the electrodes 19a and 19b, respectively, of the quartz vibrator 3 are thereby electrically connected via solder 20, and simultaneously, the circuit substrate 2 and the quartz vibrator 3 are mechanically coupled. In addition, the quartz vibrator 3 and the circuit substrate 2 are bonded together using an adhesive 6 applied to the top surface of the wall 5 of the circuit substrate 2. The adhesive 6 is a thermosetting adhesive and has a level of heat resistance so as not to deteriorate at the melting temperature of the solder 20. The application area of the adhesive 6 includes the four sides of the top surface of the wall 5, as indicated by shading in FIG. 2, or may be only two opposing sides among these four sides. From the viewpoint of coating work ability, the two opposite sides provide a sufficient the application area. To obtain a greater bonding strength of the adhesive, however, the application area may be the entire top surface of the wall 5, except at the sites of the electrodes 7a and 7b.

In the quartz oscillator unit 1 having the above-described features, when the quartz oscillator unit 1 is mounted on an printed-circuit substrate, and soldered to the printed-circuit substrate by reflow soldering or flow soldering, or when, for repair, the printed-circuit substrate on which the quartz oscillator unit 1 is mounted is placed on a heating plate, and the quartz oscillator unit 1 is removed from the printed-circuit substrate, the adhesive force between the quartz vibrator 3 and the circuit substrate 2 is maintained by the adhesive 6 even when the solder 20 melts due to the heat of the reflow furnace, the flow soldering device, the heating plate for repair, or other heat source. This prevents the quartz vibrator package 3 from developing defects such as lifting or falling off the circuit substrate 2 in the mounting or repairing process.

Also, since the adhesion area between the quartz vibrator 3 and the circuit substrate 2 increases by adhering the quartz vibrator 3 to the circuit substrate 2 by the adhesive 6, the transverse rupture strength of the quartz oscillator unit 1 is greatly improved, and the strength thereof is greatly increased.

Figure 5A:
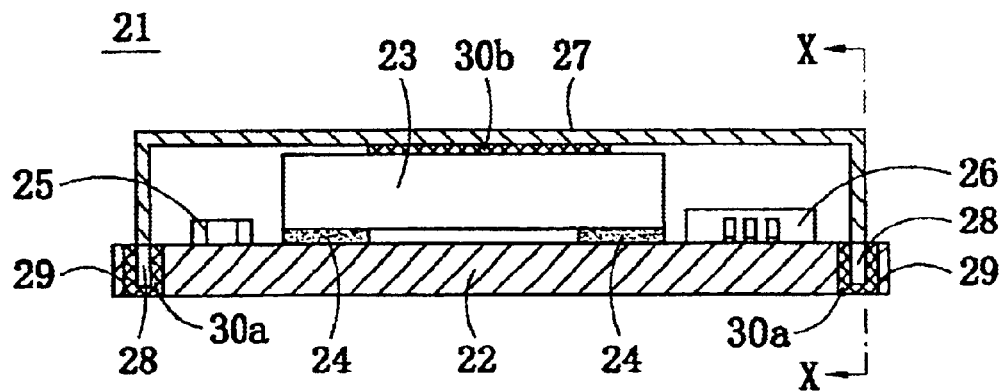
FIG. 5A is a sectional view illustrating a quartz oscillator unit in accordance with another preferred embodiment of the present invention.
Figure 5B:
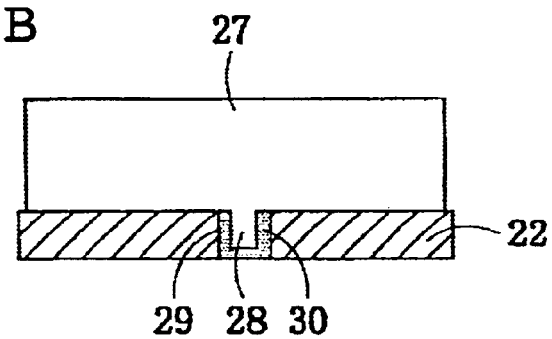
FIG. 5B is a sectional view taken along the line X-X in FIG. 5A.
Figure 6:
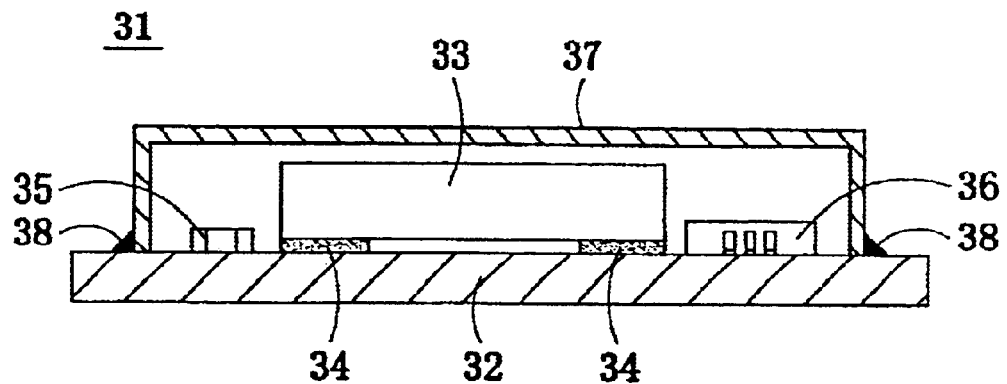
FIG. 6 is a sectional view illustrating a conventional quartz oscillator unit.

FIG. 5A is a sectional view illustrating a quartz oscillator unit 21 in accordance with another preferred embodiment of the present invention. FIG. 5B is a sectional view taken along the line X-X in FIG. 5A. In this quartz oscillator unit 21, a quartz vibrator 23 is placed on a flat circuit substrate 22, and electrodes on the bottom surface of the quartz vibrator 23 are bonded to electrode pads of the circuit substrate 22 with solder 24. Also, circuit components 25 and 26 defining an oscillating circuit, a temperature compensation circuit, or other suitable components, are mounted on the circuit substrate 22.

A metallic shielding case 27 which acts as a cap is provided on the circuit substrate 22 to cover the quartz vibrator 23, and the circuit components 25 and 26. On the bottom surface of each of both end portions of the shielding case 27, a claw (protrusion) 28 is extended. Correspondingly, a through hole 29 is provided in each of both end portions of the circuit substrate 22, and the shielding case 27 is fixed to the circuit substrate 22 by inserting each of the claws 28 of the shielding case 27 into one of the through holes 29 and by fixing each of the claws 28 by an adhesive 30a provided in each of the through holes 29. The inner surface of the shielding case is adhered to the top surface of the quartz vibrator 23 by an adhesive 30b. Each of the adhesives 30a and 30b is also a thermosetting adhesive and has a level of heat resistance to with stand the melting temperature of the solder 20.

The shielding case 27 is grounded to the shielding plate of the quartz vibrator 23 via a conductive adhesive 30b. Alternatively, the shielding case 27 may be grounded via the wiring patterns provided on the top surface of the circuit substrate 22, or may be grounded by grounding the through holes 29 and by adhering each of the claws 28 to one of the through holes 29 by the conductive adhesive 30a.

In this quartz oscillator unit 21, since each of the claws 28 of the shielding case 27 are inserted into one of the through holes 29 of the circuit substrate 22, and each of the claws 28 are fixed to one of the through holes 29 by the adhesive 30a, the shielding case 27 is easily positioned with respect to the circuit substrate 22, even when the size of the circuit substrate 22 is reduced.

Furthermore, in this quartz oscillator unit 21, the quartz vibrator 23 is adhered to the shielding case 27 which is fixed to the circuit substrate 22 by the adhesive 30a, and hence, when the quartz oscillator unit 21 is mounted on a printed-circuit substrate, and is soldered to a printed-circuit substrate by reflow soldering or flow soldering, or when, for repair, the printed-circuit substrate on which the quartz oscillator unit 21 is mounted is placed on a heating board, and the quartz oscillator unit 21 is removed from the printed-circuit substrate, the vibrator package 23 is prevented from developing defects such as lifting or falling off the circuit substrate 22 in the mounting or repairing process, even when the solder melts via the heat of a reflow furnace, a flow soldering device, a heating plate for repair, or other heating source.

Meanwhile, the mechanism for fixing the shielding case 27 to the quartz vibrator 23 is not limited to the adhesive 30b, but may instead be solder or other suitable material. Even when solder is used, the quartz vibrator 23 is held by the shielding case 27, such that the quartz vibrator 23 will not lift or fall off the circuit substrate 22, as long as the shielding case 27 is not detached from the circuit substrate 22 when the solder melts.

Also, since the shielding case 27 is fixed to the quartz vibrator 23 by the adhesive 30b (or solder), the adhesion area between the shielding case 27 and the quartz vibrator 23 is increased, such that the transverse rupture strength of the quartz oscillator unit 21 is greatly improved, and the strength thereof is greatly enhanced.

In preferred embodiments of the present invention, any kind of quartz oscillator unit may be used. For example, as described above, a temperature-compensation quartz oscillator unit (TCXO) with a temperature-compensation circuit may be used, or a quartz oscillator unit without temperature compensation (SPXO) may be used. Alternatively, a voltage-control quartz oscillator unit (VCXO) may be used.

As is evident from the foregoing, in the piezoelectric oscillator unit in accordance with the first preferred embodiment of the present invention, the adhesive force of the vibrator package with respect to the circuit substrate is maintained by the adhesive, even if the solder bonding the quartz vibrator package to the circuit substrate melts due to the heat in reflow soldering, the heat of a heating plate, or other heat source, such that defects, such as lifting from the circuit substrate, sliding thereon, or falling off therefrom, to the vibrator package are prevented. In addition, by adhering the vibrator package to the circuit substrate via the adhesive, the transverse rupture strength of the piezoelectric oscillator unit is greatly enhanced.

In the piezoelectric oscillator unit in accordance with the second preferred embodiment of the present invention, the shielding case is fixed to the circuit substrate by the adhesive, and hence, even if the solder bonding the quartz vibrator package to the circuit substrate is melted by the heat in reflow soldering or the heat of a heating plate, or other heat source, the vibrator package held by the shielding case is prevented from developing defects such as being isolated from the circuit substrate, sliding thereon, or falling off therefrom.

While preferred embodiments of the present invention have been described, it is to be understood that modifications will be apparent to those skilled in the art without departing from the scope and spirit of the invention.

What is claimed is:

1. A piezoelectric oscillator unit comprising:
   a circuit substrate including a cavity provided therein and a wall provided around the cavity, the wall having a top surface with electrodes disposed thereon, the circuit substrate having an oscillatory circuit mounted in the cavity thereof;
   a vibrator package overlaid on said circuit substrate, said vibrator package housing a piezoelectric member therein and said vibrator package having electrodes provided on a bottom surface thereof which are bonded to electrodes provided on the top surface of the wall of said circuit substrate; and
   an adhesive arranged between the top surface of said wall of the circuit substrate and the bottom surface of said vibrator package to bond said circuit substrate and said vibrator package together; wherein
   the circuit substrate is defined by a multilayer ceramic substrate, and the cavity is disposed at the approximate center thereof to mount components; and
   a transistor for oscillation and buffer amplification, a varicap diode, a multilayer capacitor, a chip thermistor for temperature compensation, and a chip resistor are surface-mounted within said cavity.

2. A piezoelectric oscillator unit comprising:
   a circuit substrate including a cavity provided therein and a wall provided around the cavity, the wall having a top surface with electrodes disposed thereon, the circuit substrate having an oscillatory circuit mounted in the cavity thereof;
   a vibrator package overlaid on said circuit substrate, said vibrator package housing a piezoelectric member therein and said vibrator package having electrodes provided on a bottom surface thereof which are bonded to electrodes provided on the top surface of the wall of said circuit substrate;
   an adhesive arranged between the top surface of said wall of the circuit substrate and the bottom surface of said vibrator package to bond said circuit substrate and said vibrator package together;
   a case arranged to receive said vibrator package; and
   a shielding plate arranged on said case to hermetically seal said vibrator package.

3. A piezoelectric oscillator unit comprising:
   a circuit substrate including a cavity provided therein and a wall provided around the cavity, the wall having a top surface with electrodes disposed thereon, the circuit substrate having an oscillatory circuit mounted in the cavity thereof;
   a vibrator package overlaid on said circuit substrate, said vibrator package housing a piezoelectric member therein and said vibrator package having electrodes provided on a bottom surface thereof which are bonded to electrodes provided on the top surface of the wall of said circuit substrate; and
   an adhesive arranged between the top surface of said wall of the circuit substrate and the bottom surface of said vibrator package to bond said circuit substrate and said vibrator package together; wherein
   said circuit substrate via holes arranged to connect said electrodes provided on the bottom surface of said circuit substrate to said electrodes provided on said top surface of said circuit substrate wall.

4. A piezoelectric oscillator unit comprising:
   a circuit substrate having an oscillatory circuit mounted thereon;
   a vibrator package overlaid on said circuit substrate, said vibrator package housing a piezoelectric member therein and said vibrator package having electrodes provided on a bottom surface thereof which are bonded to electrodes provided on the top surface of said circuit substrate;
   a shielding case covering said vibrator package so that said shielding case contains said vibrator package; and
   an adhesive arranged to adhere said shielding case to said circuit substrate;
   wherein said shielding case is provided with protrusions, said circuit is provided with holes, each of said protrusions is inserted into a corresponding one of said holes, and said protrusions are fixed in said holes by said adhesive which is filled in said holes.

5. A piezoelectric oscillator unit according to claim 4, wherein said adhesive is a thermosetting adhesive.

6. A piezoelectric oscillator unit according to claim 4, wherein said protrusions of said shielding case are claws.

7. A piezoelectric oscillator unit comprising:
   a circuit substrate having an oscillatory circuit mounted thereon;
   a vibrator package overlaid on said circuit substrate, said vibrator package housing a piezoelectric member therein and said vibrator package having electrodes provided on a bottom surface thereof which are bonded to electrodes provided on a top surface of said circuit substrate;
   a shielding case covering said vibrator package so that said shielding case contains said vibrator package; and
   an adhesive arranged to adhere said shielding case to said circuit substrate;
   wherein the circuit substrate is defined by a multilayer ceramic substrate, and includes a cavity disposed at the approximate center thereof to mount components;
   said multilayer ceramic substrate includes a wall provided around the cavity; and
   said electrodes are provided at four corners of the top surface of the wall, and external electrodes are provided at four corners of the bottom surface of the wall.

* * * * *